(12) United States Patent
Liu et al.

(10) Patent No.: US 7,151,785 B2
(45) Date of Patent: Dec. 19, 2006

(54) OPTOELECTRONIC DEVICES AND METHODS OF PRODUCTION

(75) Inventors: Yue Liu, Plymouth, MN (US); Klein L. Johnson, St. Paul, MN (US); Steven M. Baier, Minnetonka, MN (US)

(73) Assignee: Finisar Corporation, Sunnyvale, CA (US)

( * ) Notice: Subject to any disclaimer, the term of this patent is extended or adjusted under 35 U.S.C. 154(b) by 191 days.

(21) Appl. No.: 10/669,220

(22) Filed: Sep. 24, 2003

(65) Prior Publication Data

US 2004/0141536 A1    Jul. 22, 2004

Related U.S. Application Data

(62) Division of application No. 10/037,013, filed on Dec. 31, 2001, now Pat. No. 6,724,798.

(51) Int. Cl.
    *H01S 5/00* (2006.01)
(52) U.S. Cl. .................. 372/44.01; 372/50.1
(58) Field of Classification Search ............ 372/44.01, 372/50.1, 50.21
    See application file for complete search history.

(56) References Cited

U.S. PATENT DOCUMENTS

| | | |
|---|---|---|
| 3,821,092 A | 6/1974 | Frobenius |
| 3,900,864 A | 8/1975 | Dapkus et al. |
| 4,295,058 A | 10/1981 | Lade et al. |
| 4,467,521 A | 8/1984 | Spooner et al. |
| 4,549,927 A | 10/1985 | Goth et al. |
| 4,643,534 A | 2/1987 | Chun et al. |
| 4,657,628 A | 4/1987 | Holloway et al. |
| 4,675,073 A | 6/1987 | Douglas |
| 4,676,866 A | 6/1987 | Tang et al. |
| 4,717,681 A | 1/1988 | Curran |
| 4,745,081 A | 5/1988 | Beyer et al. |
| 4,746,219 A | 5/1988 | Holloway et al. |
| 4,755,697 A | 7/1988 | Kinzer |
| 4,804,636 A | 2/1989 | Groover, III et al. |
| 4,829,347 A | 5/1989 | Cheng et al. |
| 4,849,344 A | 7/1989 | Desbiens et al. |
| 4,890,141 A | 12/1989 | Tang et al. |
| 4,924,284 A | 5/1990 | Beyer et al. |
| 4,975,756 A | 12/1990 | Haken et al. |
| 5,003,365 A | 3/1991 | Havemann et al. |
| 5,010,032 A | 4/1991 | Tang et al. |
| 5,072,276 A | 12/1991 | Malhi et al. |
| 5,102,809 A | 4/1992 | Eklund et al. |
| 5,206,182 A | 4/1993 | Freeman |
| 5,293,053 A | 3/1994 | Malhi et al. |
| 5,294,823 A | 3/1994 | Eklund et al. |
| 5,331,658 A | 7/1994 | Shieh et al. |
| 5,365,082 A | 11/1994 | Gill et al. |
| 5,468,656 A | 11/1995 | Shieh et al. |

(Continued)

*Primary Examiner*—James Menefee
(74) *Attorney, Agent, or Firm*—Workman Nydegger

(57) ABSTRACT

The invention includes both devices and methods of production. A device in accordance with the invention includes a top surface and a bottom surface, a through wafer via extending from the top surface to the bottom surface, an optoelectronic structure and an ion implanted isolation moat, wherein the optoelectronic structure and the through wafer via are enclosed within the isolation moat. A method in accordance with the invention is a method of producing a device that includes the steps of forming an optoelectronic structure, forming a through wafer via, extending from a top surface to a bottom surface of the device and forming an ion implanted isolation moat, wherein the through wafer via and the optoelectronic structure are enclosed by the isolation moat.

20 Claims, 6 Drawing Sheets

U.S. PATENT DOCUMENTS

| | | |
|---|---|---|
| 5,532,173 A | 7/1996 | Martin et al. |
| 5,608,255 A | 3/1997 | Martin et al. |
| 5,683,939 A | 11/1997 | Schrantz et al. |
| 5,869,875 A | 2/1999 | Hebert |
| 5,893,722 A | 4/1999 | Hibbs-Brenner et al. |
| 5,896,408 A | 4/1999 | Corzine et al. |
| 5,977,604 A | 11/1999 | Babic et al. |
| 6,021,147 A | 2/2000 | Jiang et al. |
| 6,097,748 A | 8/2000 | Huang et al. |
| 6,154,476 A * | 11/2000 | Nishiguchi et al. ...... 372/46.01 |
| 6,724,798 B1 * | 4/2004 | Liu et al. ...................... 372/96 |
| 6,807,131 B1 * | 10/2004 | Hesselink et al. ....... 369/13.13 |
| 6,830,940 B1 * | 12/2004 | Wasserbauer et al. ........ 438/14 |
| 6,937,637 B1 * | 8/2005 | Thornton et al. ............. 372/93 |

* cited by examiner

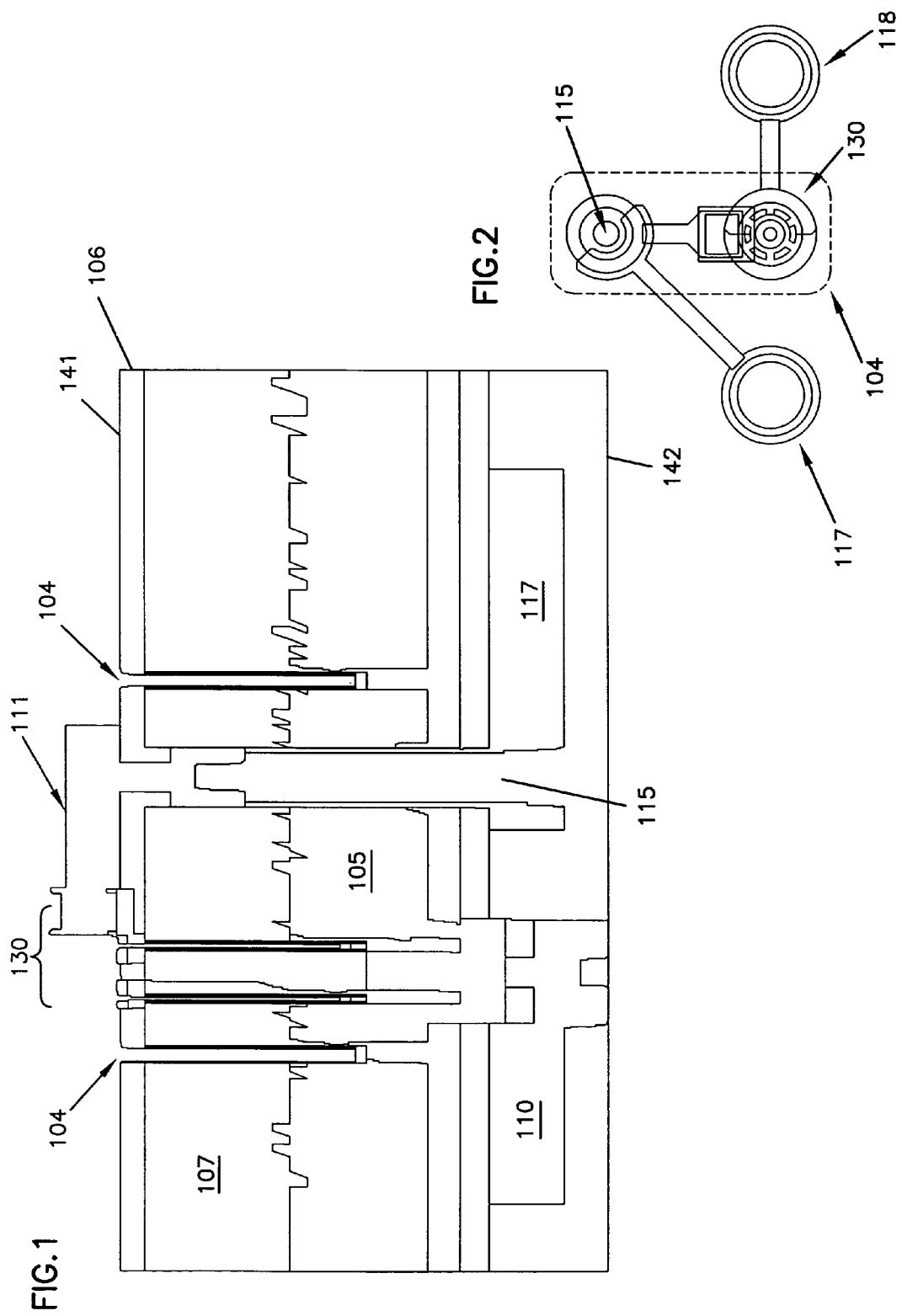

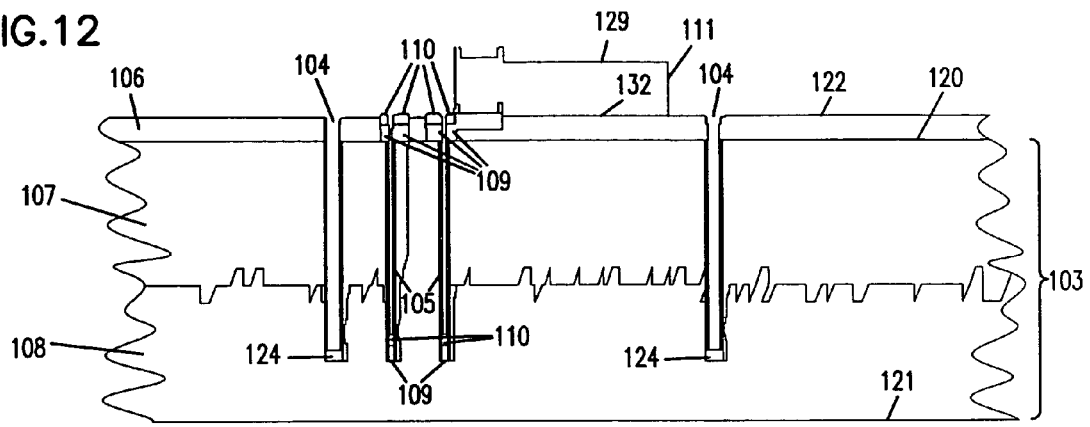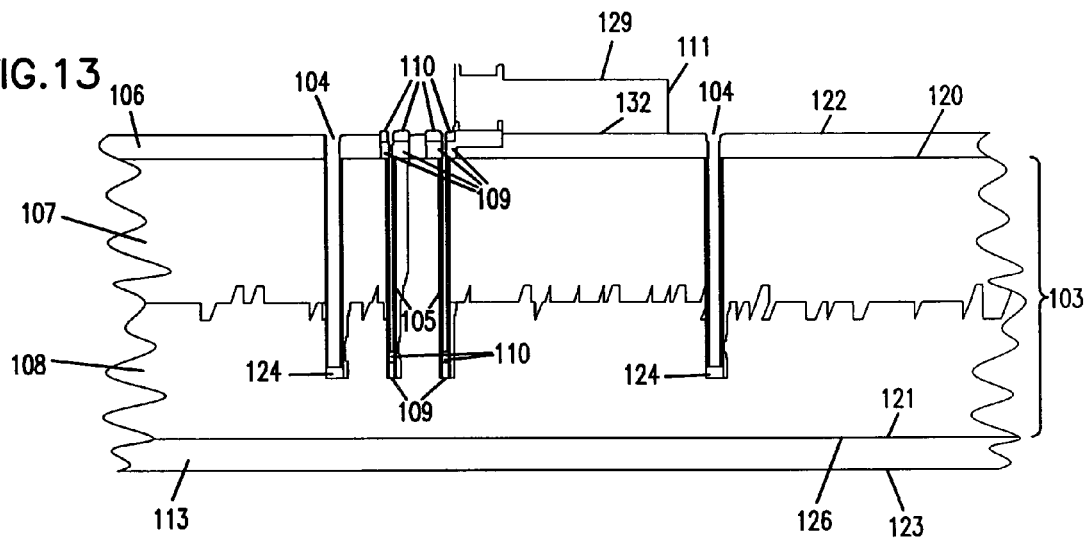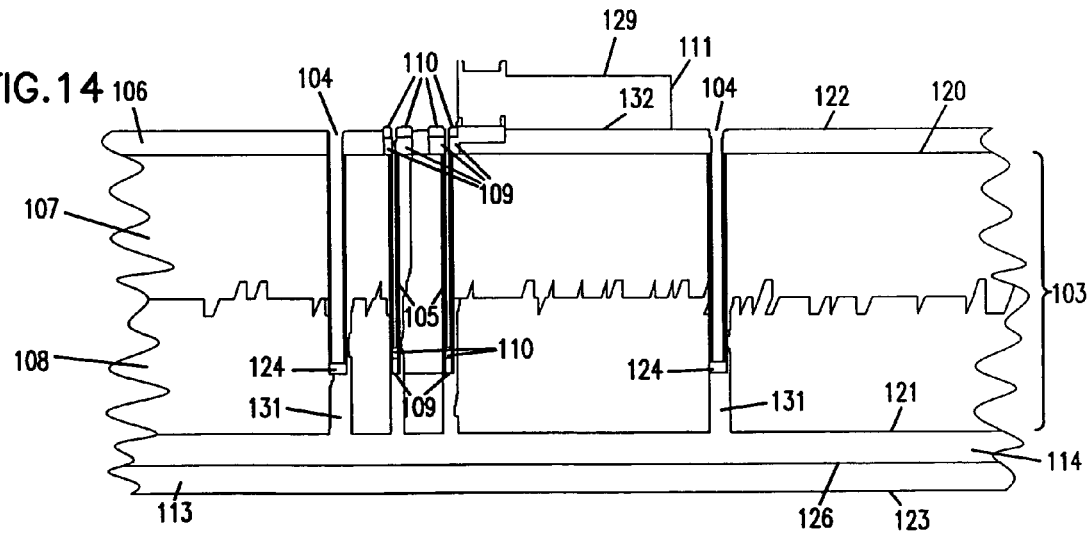

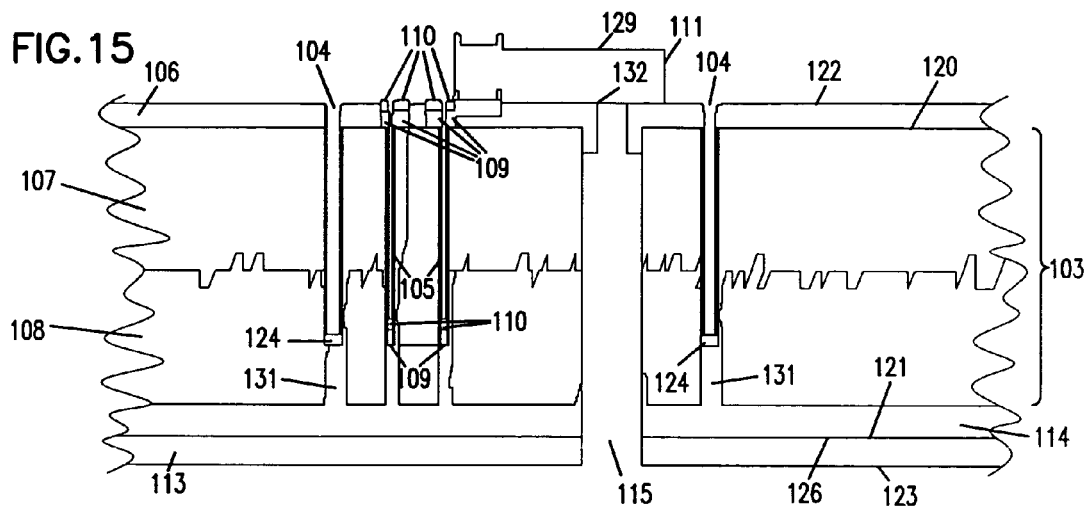
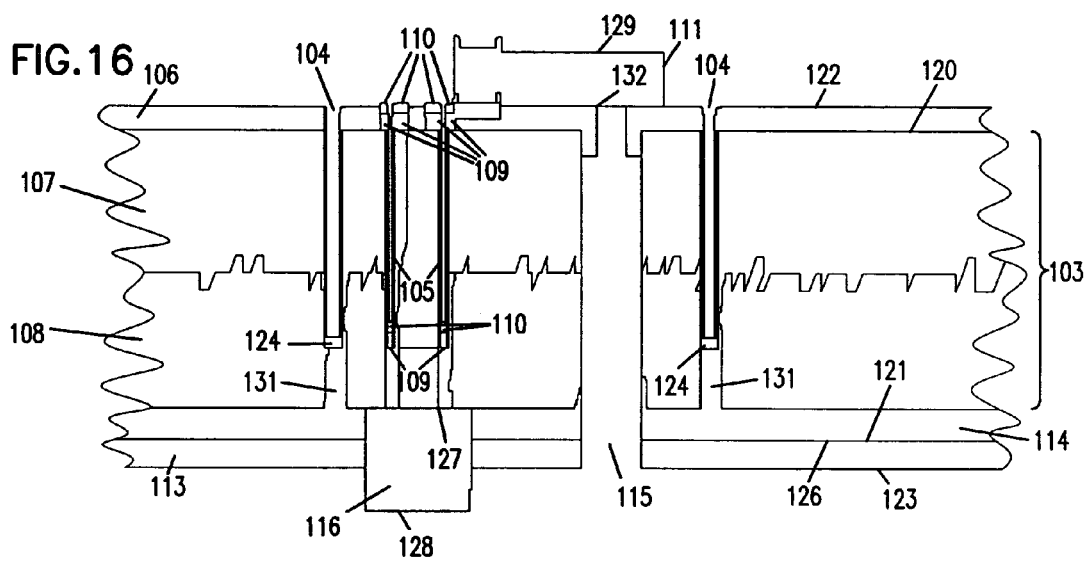
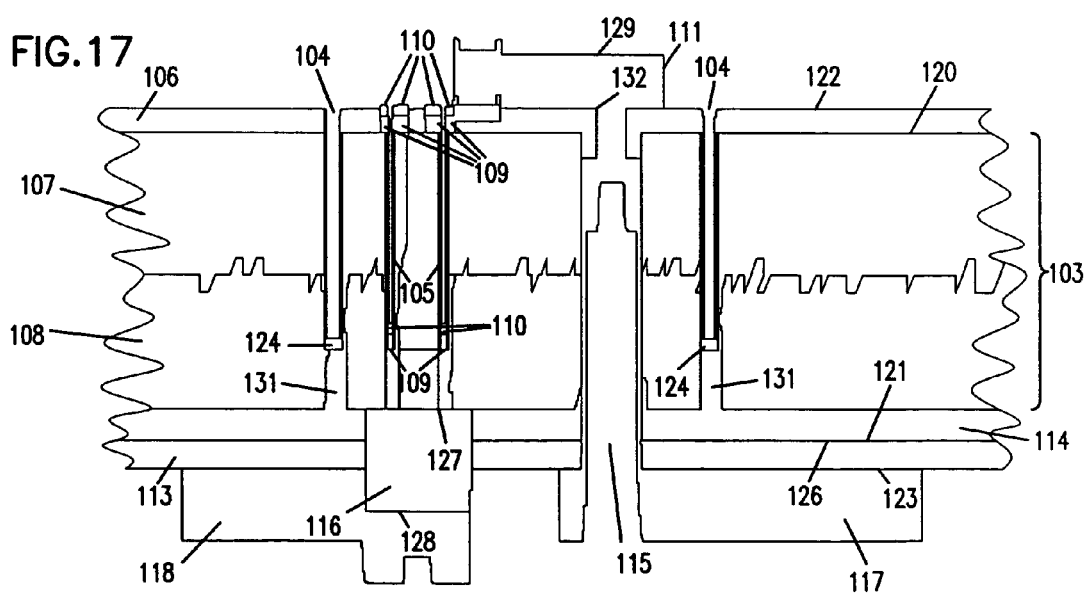

OPTOELECTRONIC DEVICES AND METHODS OF PRODUCTION

This application is a divisional of application Ser. No. 10/037,013, filed Dec. 31, 2001, now U.S. Pat. No. 6,724,798 which application(s) are incorporated herein by reference.

UNITED STATES GOVERNMENT RIGHTS

This invention was made with the United States Government support under 70NAHB8H4023 awarded by National Institute of Standards and Technology (NIST).

FIELD OF THE INVENTION

The invention generally pertains to a novel production method and the resulting optoelectronic devices. More particularly, the invention pertains to a novel method of producing optoelectronic devices, such as vertical cavity surface emitting lasers (VCSELs) and providing isolated contacts for these devices, enabling their use in high speed, low cost multi-device arrays.

BACKGROUND OF THE INVENTION

Smart pixel arrays (SPAs) are devices containing arrays of vertical cavity surface emitting lasers (VCSELs) and photodetectors. SPAs are capable of performing high-speed switching and routing of digital data. The increased capabilities of SPAs require increased switching speeds and low bit error rate. This in turn requires the interconnections between devices to have low parasitic capacitance. Otherwise, the capacitance reduces switching speed and increases the bit error rate due to noise integrated on the photodetector.

Normally, the devices making up a SPA have anode and cathode contacts, one on the top and one on the bottom of the device. However, for practical low cost assembly, it is preferable to have both contacts on one side (usually the non-emitting side) of the wafer. This enables the SPA to be easily flip-chip bonded to the integrated circuit that interfaces with the SPA.

Thus, it is necessary to use a through-wafer via to bring the one contact to the opposite side of the device. This configuration may be the largest contributor to parasitic capacitance, due to the proximity of the signal line to the common substrate. The parasitic capacitance of the structure is substantial because of the large surface area of the anode pad. However, the size of the anode pad cannot be reduced without compromising yield of the flip-chip interconnect process. To counteract this problem, protons are implanted between the VCSEL devices. Although this reduces the parasitic capacitance, it does not eliminate it or reduce it to an acceptable level.

The structure of SPAs also generally require the anode of the VCSEL to be driven instead of the cathode because the cathodes are common to all of the VCSELs when using the conventional N-type substrate. VCSELs driven by their anodes are undesirable because it requires use of slower P-channel transistors. Therefore, it is desirable to have a SPA structure in which the anode is on the same surface as the cathode and neither anode nor cathode is electrically common to the substrate.

Devices with both sources and detectors can often suffer from "cross-talk". This creates an undesirable situation where, for example, the source can alter the detected response and thereby change the perceived signal. This problem can be solved by electrically isolating the source and detector. Therefore, there exists a need for a device that is capable of electrically isolating multiple components with anode and cathode on the same surface while still maintaining low parasitic capacitance.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

In accordance with the invention, there is provided a device including a top surface and a bottom surface, a through wafer via extending from the top to the bottom surface, optoelectronic structure and an isolation moat positioned so that the optoelectronic structure and the through wafer via are enclosed within the isolation moat.

In accordance with another aspect of the invention, there is provided a device having a top and bottom surface, that includes a vertical cavity surface emitting laser, at least two anodes positioned on the top and bottom surfaces of the device, a through wafer via extending from the top surface to the bottom surface with an electrically conductive material deposited on the inner walls that electrically connect the two anodes, an isolation moat positioned to enclose the vertical cavity surface emitting laser and the through wafer via, and a moat ion implantation region positioned below the isolation moat.

In accordance with the invention, there is also provided a method of producing a device including the steps of forming an optoelectronic configuration, forming a through wafer via extending from the top surface to the bottom surface, forming an isolation moat, wherein the through wafer via and the optoelectronic structure are enclosed by the isolation moat.

The invention provides production methods and the resulting optoelectronic devices. The optoelectronic devices produced from the method of the invention are particularly well suited for use in device arrays. Devices that can be produced by the method of the invention include, for example, VCSELs, p-n junction (PIN) detectors, and other optoelectronic devices. The preferred devices are VCSELs and are preferably part of an array, an SPA. The devices of the invention are advantageous for inclusion in arrays of the devices because they decrease the parasitic capacitance that limit the effectiveness of the arrays. Parasitic capacitance is decreased by the use of an isolation moat as described herein.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

FIG. 1 represents a cross sectional view of a device in accordance with one embodiment of the invention.

FIG. 2 represents a top view of a device in accordance with one embodiment of the invention.

FIGS. 3 through 17 illustrate a method and a device in accordance with one embodiment of the invention.

It should be understood that the drawings are not necessarily to scale and that the embodiments are illustrated using graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PREFERRED EMBODIMENT

The invention includes devices and methods of producing the same with at least an optoelectronic structure, isolation moat, and through wafer via. The method of the invention includes producing an optoelectronic structure, forming a through wafer via and forming an isolation moat.

The Device

FIGS. 1 and 2 are sectional views, and it should therefore be appreciated that the illustrations depicted in FIGS. 1 and 2 can extend into and out of the drawings, thereby allowing for the depiction of arrays of the various structures.

FIG. 1 illustrates a device in accordance with one aspect of the invention. FIG. 1 is a cross sectional view of such an exemplary device. FIG. 2 also illustrates a device in accordance with one aspect of the invention. FIG. 2 is a top view of such an exemplary device showing the spatial layout of the structures given therein. As seen in FIGS. 1 and 2, a device in accordance with the invention comprises an optoelectronic structure 130, an isolation moat 104 and a through wafer via 115.

Referring to FIG. 2, the device can include any type of optoelectronic structure 130, examples of such include, LEDs; photodetectors, including photodiodes, PIN photodetectors, avalanche photodiodes, and photoconductors; and VCSELs. The device of the invention comprises at least one optoelectronic structure 130 and preferably includes a plurality of such configurations. The preferred optoelectronic structure 130 of the invention is a VCSEL. The properties and characteristics of VCSELs are discussed, for example, in Vertical Cavity Surface Emitting Lasers; Wilmsen, Temkin, and Coldren (1999) ("Wilmsen") and its disclosure is incorporated herein by reference.

Figure 4:
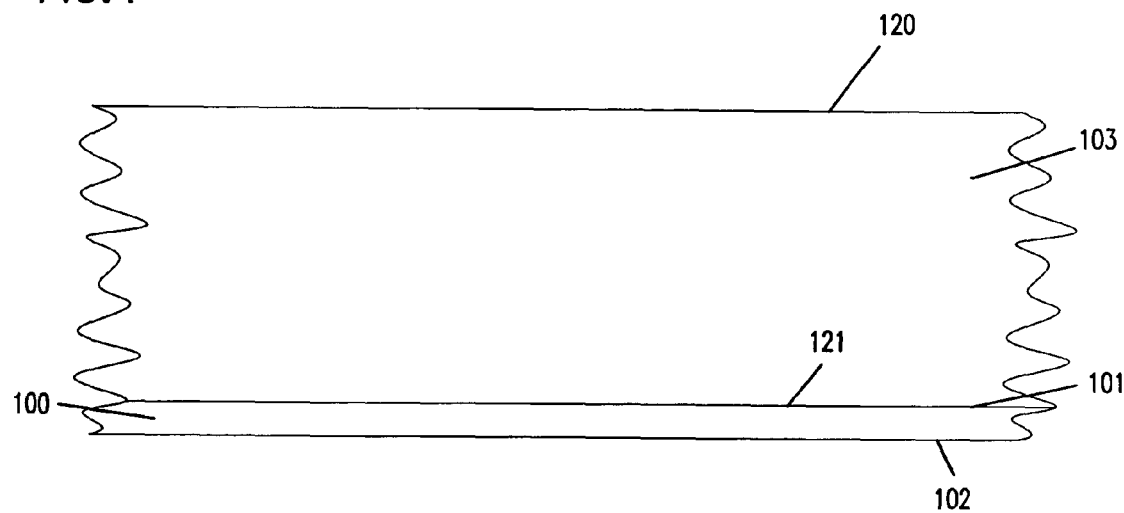

Referring to FIG. 2, the optoelectronic structure 130 is preferably a VCSEL. Generally, an optoelectronic configuration that is a VCSEL is fabricated by growing epitaxial layers 103 on a substrate 100 as shown in FIG. 4. The epitaxial layers include a bottom stack of Distributed Bragg Reflectors (DBR), an active region, and a top DBR stack. First, the bottom DBR stack is grown. Bottom DBR stack can be made of for example, layers of aluminum gallium arsenide and gallium arsenide. Generally, the bottom DBR stack is doped. Positioned on top of the bottom DBR stack is an active region which is also made of a variety of layers, and is commonly made of undoped aluminum gallium arsenide and gallium arsenide. On top of the active region is positioned a top DBR stack. Generally, the top DBR stack is similar to the bottom DBR stack except that it is oppositely doped. The specific materials utilized and the configuration of the layers, are chosen depending on the specific wavelength and operating parameters desired in the final device.

The VCSEL utilized as the optoelectronic structure 130 can be manufactured by any method commonly used to manufacture VCSELs. An example of a method for producing a VCSEL in accordance with the invention can be found in Wilmsen and U.S. Pat. No. 5,893,722 (Hibbs-Brenner et al.) ("Hibbs-Brenner"), incorporated herein by reference.

A device containing a PIN detector as the optoelectronic configuration is also in accordance with the invention. The manufacture of a PIN detector as the optoelectronic structure 130 of the device is preferably carried out similarly to the VCSEL above with minor modifications. The substrate depicted in FIG. 1 would not be modified, but the materials for the epitaxial layer 103 of the optoelectronic structure 130 would be different.

Any suitable method of producing PIN detectors and structures produced thereby could be utilized for formation of a device in accordance with one aspect of the invention. A preferred structure for the PIN epitaxial layers 103 is (starting with top layer): P+ doped contact layer, GaAs typically 0.5 μm thick—doped at $10^{19}/cm^3$, P+ barrier layer, AlGaAs typically 2 μm thick—doped at $10^{19}/cm^3$, Active layer, GaAs typically 2 μm thick—doped at $10^{15}/cm^3$ or less, N+ barrier layer, AlGaAs typically 2 μm thick—doped at $10^{18}/cm^3$. Another alternative structure of PIN epitaxial layer 103 can be produced by utilizing the above scheme and change the AlGaAs layers to GaAs layers.

In the formation of a PIN photodetector as an optoelectronic structure 130 of the invention, another etching step would be necessary to selectively etch layers on the topside of the structure where the active photodetector region will be located. This etching step can be done by any suitable etching method known to those skilled in the art, such as wet etching.

A device containing at least one VCSEL optoelectronic structure 130 and at least one PIN photodetector optoelectronic structure 130 is also in accordance with one aspect of the invention. Any suitable method of forming this combination could be employed in the method of the invention. A preferred method of forming a device containing a VCSEL and a photodetector is to form the photodetector epitaxial layers on top of the VCSEL epitaxial layers and then selectively remove the photodetector epitaxial layers to expose the VCSEL epitaxial layers where desired. A preferred method of removing the photodetector epitaxial layers is by using mesa etching.

Devices containing other types of optoelectronic structures 130 are also in accordance with the invention. The production of such a device would be similar to the examples given above with modifications necessary only to create the specific optoelectronic structure 130 to be included in the invention.

Another preferred embodiment of the device of the invention comprises an array of optoelectronic structures 130 prepared in accordance with the invention. The array of optoelectronic structures 130 can include any such optoelectronic structure 130, but more preferably includes an array of VCSELs. Arrays of optoelectronic structures 130, preferably VCSELs, can be formed in one- two- or three-dimensions. Devices in accordance with the invention are particularly well suited for arrays, because the devices of the invention have very low parasitic capacitance, have the anode and cathode on the same side, and allow a driver circuit to drive either the anode or cathode of the VCSEL.

A device in accordance with the invention also includes a through wafer via 115. Through wafer via 115 extends from the top surface 141 to the bottom surface 142 of the device. Referring to FIG. 1, the through wafer via 115 is positioned within the area defined by the area inside the isolation moat 104. The purpose of the through wafer via 115 is to make electrical contact between an anode on the topside and an anode on the bottom side. Alternatively, the through wafer via 115 can function to connect a cathode on the bottom side with a cathode on the topside. This connection allows the optoelectronic structure 130 to be driven by the bottom side anode, which greatly improves its capabilities.

The through wafer via 115 is formed by an etching process. If the through wafer via 115 is formed to connect the anodes, an area is etched from the topside of the structure and extends through the entire depth of the structure. If the through wafer via 115 is formed to connect the cathodes, an area is etched from the bottom side of the structure and extends through the entire depth of the structure. The through wafer via 115 can be etched with any suitable etching method such as Reactive Ion Etching (RIE), or other isotropic etch methods capable of etching through the entire device structure in a reasonable time period. Preferably, the through wafer via 115 is etched with RIE.

After the through wafer via 115 has been formed, the sidewalls of the through-wafer via 115 are first coated with an insulating dielectric, typically $SiO_2$. The insulating dielectric serves to prevent the conductive material (applied next) from shorting electrically to the substrate. Next the through wafer via 115 is coated, typically by electroplating, with a conductive material. The conductive material can be formed from any suitable conductive material, such as a metal; e.g., gold (Au), silver (Ag), copper (Cu), aluminum (Al), tungsten (W), an alloy, e.g., aluminum/copper (Al/Cu), titanium tungsten (TiW), or the like. Preferably, the conductive material that is utilized is gold.

A device in accordance with the invention also includes an isolation moat 104. The purpose of the isolation moat 104 is to reduce the overall parasitic capacitance of the device of the invention. The isolation moat 104 is positioned so that it surrounds the optoelectronic device 130, and the through wafer via 115. This reduces the parasitic capacitance of the entire structure by placing the capacitance of the isolation moat 104 in series with the parasitic capacitance of the anode or cathode (whichever the through wafer via 115 is being used with). Therefore, the overall capacitance of the structure is the smaller of the two capacitances; that of the isolation moat 104. The capacitance of the isolation moat 104 is small enough to allow the array of devices necessary for SPAs to be effective for its desired purposes.

The isolation moat 104 can be formed using etching, ion implantation, or a combination thereof. Preferably, isolation moat 104 is formed by a combination of etching and ion implantation. Isolation moat 104 serves to electrically isolate an area of the device from another area of the device. The electrical isolation is accomplished either by proton implantation, by creation of a gap (formed by an etching process), or a combination thereof. If the thickness of the device is such that protons can penetrate through the entire depth of the device, it is not necessary to etch. However, if the thickness of the device is such that generally utilized implantation techniques cannot penetrate the entire thickness, a gap can be etched so that the protons have less thickness to penetrate. In that situation, anywhere from 0 to 100% of the thickness of the device can be etched to allow proton implantation from one surface to contact proton implantation from the opposite surface.

In the preferred method of forming isolation moat 104, an area is etched from the top or bottom surface of the wafer of the structure and extends throughout some portion of the depth of the structure. The isolation moat 104 can be etched with any suitable etching method such as RIE, wet etching, or dry etching techniques. Preferably, the isolation moat 104 is etched with RIE. After the isolation moat 104 is etched, ions are implanted into isolation moat 104 and beneath isolation moat 104. On the side with isolation moat 104, the implantation should occur after isolation moat 104 is etched. The combination of isolation moat 104 and the ion implantation effectively isolates each optoelectronic structure 130 from adjacent devices and causes the low capacitance across the isolation moat 104. The ion implantation can be carried out with any ion that generates isolation in the crystalline host material. Preferably, hydrogen is used for implantation. The ion implantations should completely isolate the optoelectronic structure 130; therefore the upper and lower ion implantation regions are to be configured such that they contact each other.

Isolation moat 104 can also be formed by ion implantation alone. This method of forming isolation moat 104 can be employed if the device of the invention is thin enough for ions to penetrate through the entire depth of the device from one side or from both sides and produce the electrical isolation necessary for the device.

Processing

FIGS. 3 through 17 depict an exemplary method in accordance with one aspect of the invention. FIGS. 3 through 11 depict topside processing steps, and FIGS. 12 through 17 depict bottom side processing steps.

Figure 3:
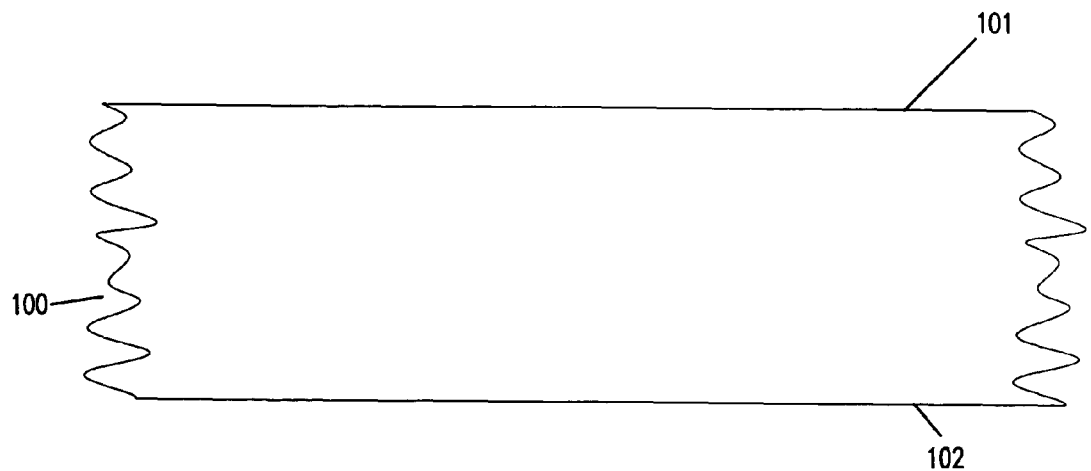

FIG. 3 depicts an electrically conductive substrate 100 with an upper surface 101 and a lower surface 102. Generally, substrate 100 is made of any suitable semiconductor material, such as gallium arsenide, silicon, or the like. Preferably, the substrate 100 is made of gallium arsenide, which facilitates the growth of additional layers of gallium arsenide or its derivatives. Substrate 100 is generally from about 250 to 1000 μm thick. Preferably, substrate 100 is from 500 to 700 μm. More preferably, the substrate 100 is from 600 to 650 μm. A preferred embodiment is such that the substrate 100 is 625 μm.

FIG. 4 depicts an exemplary device after completion of the second step of the process, the growth of the optoelectronic structure, in this embodiment, growth of VCSEL epitaxial layers 103 on the upper surface 101 of the substrate 100. The epitaxial layer 103 has a first surface 120 and a second surface 121. The second surface 121 contacts the upper surface 101 of the substrate 100.

Formation of the epitaxial layer 103 of a VCSEL device can be completed by any suitable method. An exemplary method of producing a VCSEL can be found in the Hibbs-Brenner patent. Generally speaking, the epitaxial layer 103 can be deposited by any suitable epitaxial method or technique, such as Metal Organic Chemical Vapor Deposition (MOCVD), Molecular Beam Epitaxy (MBE), Chemical Beam Epitaxy, (CBE), or the like.

Preferably, the epitaxial layer 103 is deposited by Metal Organic Chemical Vapor Deposition (MOCVD). The epitaxial layer 103 can be formed of a number of materials, depending on the ultimate use of the VCSEL, examples of such materials include, Ga—N, ZnSe, AlGaInP, GaAs, AlGaAs, InGaAs, GaInAsSb—AlGaAsSB, InAsSb—AlInAsSb. Preferably, the epitaxial layer 103 is formed of GaAs, AlGaAs, and combinations thereof. The epitaxial layer 103 is made up of from about 50 to 100 individual layers, as is common in the production of VCSEL devices. The epitaxial layer 103 is preferably on the order of 0.1–10 µm thick, more preferably the epitaxial layer 103 is about 8 µm thick. Specific conditions for forming epitaxial layer 103 can be found in Hibbs-Brenner.

Figure 5:
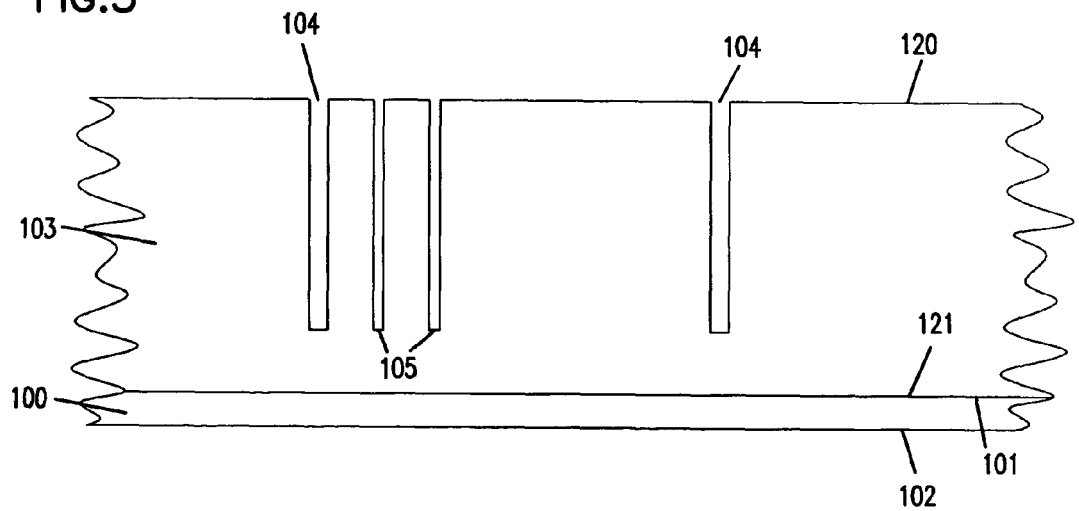

FIG. 5 depicts an exemplary device after completion of the next process step, formation of the isolation moat. Isolation moat 104 is formed to lower the resulting capacitance of the final structure. Isolation moat 104 is of a configuration that it serves to electrically isolate the semiconductor material within the moat while not crossing through wafer via 115 while not crossing any interconnect metal. Isolation moat 104 can comprise any structure or formation that accomplishes this purpose. Therefore, isolation moat 104 includes structures formed by etching, implantation, or a combination thereof.

Isolation moat 104 can be formed in a number of different configurations. The isolation moat 104 can generally be formed by etching from the topside of the device, and implanting ions from the top and bottom side of the device. This configuration is useful in the situation where the through wafer via 115 functions to allow for creation of an anode pad on the bottom side of the device. A second possible configuration of isolation moat 104 can be formed by etching from the bottom side of the device, and implanting ions from the top and bottom side of the device. This configuration is useful in the situation where the through wafer via 115 functions to allow for creation of a cathode pad on the topside of the device.

In these configurations, isolation moat 104 is preferably formed by a combination of etching and ion implantation. Preferably, isolation moat 104 is formed through a combination of RIE and ion implantation. An exemplary set of conditions for forming the oxidation trenches is to etch for about 9 minutes using C12/BC13 as an etching gas at a chamber pressure of about 15 mT and about 100 W of power. Ion implantation is then performed from both sides of the device at 100, 200, and 300 keV, at a dose of $10^{15}/cm^2$. Alternatively, if the thickness of the device allows, isolation moat 104 can be formed by ion implantation alone.

Oxidation trenches 105 are an optional feature of the VCSEL structure. Oxidation trenches 105 if formed, are created to direct the current flow in the VCSEL lasing structure. The method of the invention, and products produced thereby includes those including etching of oxidation trenches 105 and those not including etching of oxidation trenches. If the optional oxidation trenches 105 are formed, they can be formed using RIE. Optional oxidation trenches 105 are preferably on the order of 2–10 µm deep, and more preferably are about 6 µm deep. An exemplary set of conditions for forming the oxidation trenches is to etch for about 9 minutes using C12/BC13 as an etching gas at a chamber pressure of about 15 mT and about 100 W of power.

Figure 6:
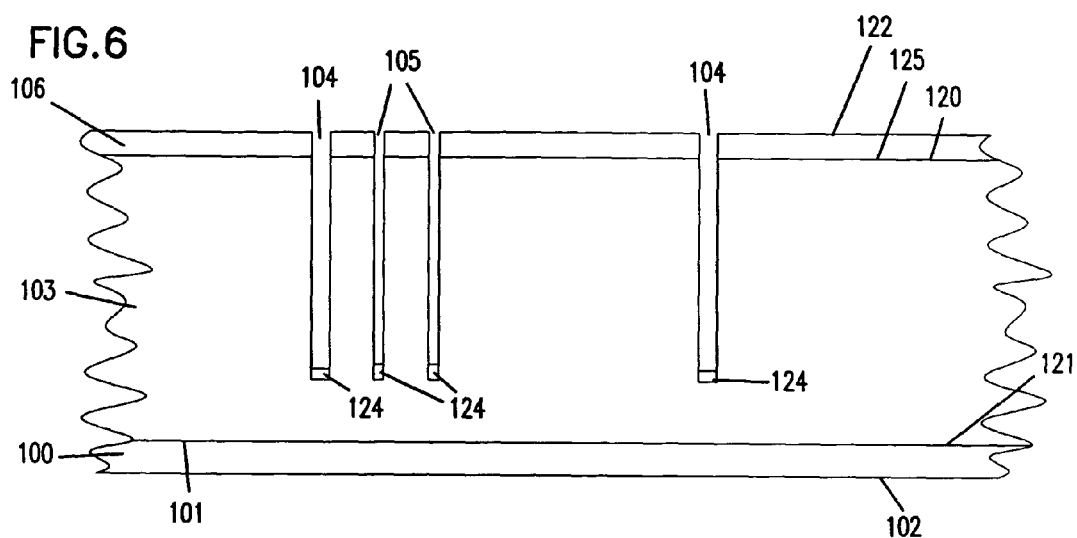

FIG. 6 depicts an exemplary device after the subsequent step of the process, deposition of a dielectric material. A dielectric material is deposited on the second surface 120 of the epitaxial layer 103, forming a first dielectric layer 106. The first dielectric layer 106 has a first surface 122 and a second surface 125. The second surface 125 contacts the second surface 120 of the epitaxial layer 103. The dielectric material also forms dielectric deposits 124 in the bottom of the isolation moat 104 and oxidation trenches 105. The first dielectric layer 106 and dielectric deposits 124 can be made of any material that is known to be dielectric, such as silicone dioxide ($SiO_2$) or silicon nitride ($Si_3N_4$). Preferably, the first dielectric layer 106 and the dielectric deposits 124 are made of silicon dioxide ($SiO_2$).

The dielectric material can be deposited by any method known in the art. Preferably, the dielectric material is deposited by plasma enhanced chemical vapor deposition (PECVD). The thickness of the first dielectric layer 106 and dielectric deposits 124 can vary depending on the specific application. For example, the thickness can range from 1000 to 5000 angstroms. Preferably, the thickness of the first dielectric layer 106 and dielectric deposits 124 is about 300 angstroms.

Figure 7:
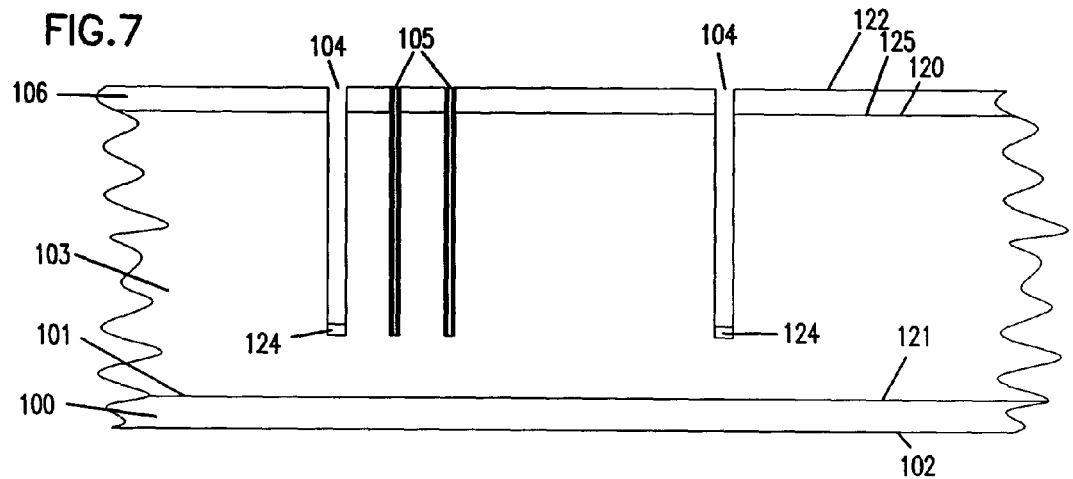

FIG. 7 depicts an exemplary device after the next step of the process, oxidation of the oxidation trenches 105. The oxidation of the oxidation trenches 105 is accomplished in an oxidation furnace. The oxidation of the oxidation trenches 105 also removes the dielectric deposits 124 on the bottom of the oxidation trenches 105. The oxidation also removes portions of the first dielectric layer 106 around the oxidation trenches 105. Exemplary conditions for oxidation are performed with an anneal tube with flowing $H_2O$ vapor at 400° C. for 10 minutes.

Figure 8:
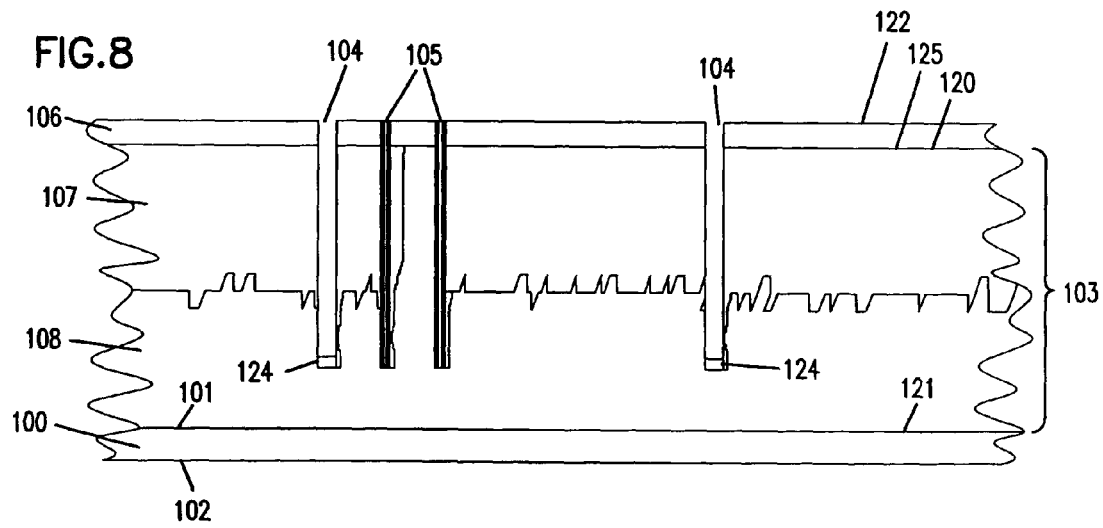

FIG. 8 depicts an exemplary device after the next step in the process, implantation of ions into the epitaxial layer 103. Ions are implanted into epitaxial layer 103 through the first surface 122 of the dielectric layer 106. The ions that are implanted into epitaxial layer 103 only penetrate through a portion of epitaxial layer 103. This creates an upper implanted region 107 and a non-implanted region 108 of epitaxial layer 103.

The ion implantation into epitaxial layer 103 can be achieved by implanting any suitable ion, such as boron, oxygen, or hydrogen. A preferred ion for implantation is hydrogen. Typically, the hydrogen ions are implanted with an energy that ranges from about 20 to 400 keV, with about 50 to 300 keV being a preferred range. The dose of hydrogen atoms to be implanted ranges from about $10^{12}$ to $10^{16}/cm^2$, with a preferred range being from about $10^{14}$ to $10^{15}/cm^2$. Specific exemplary conditions for the implantation of ions are to use multiple implants at 100, 200, and 300 keV, all at a dose of $10^{15}/cm^2$.

Figure 9:
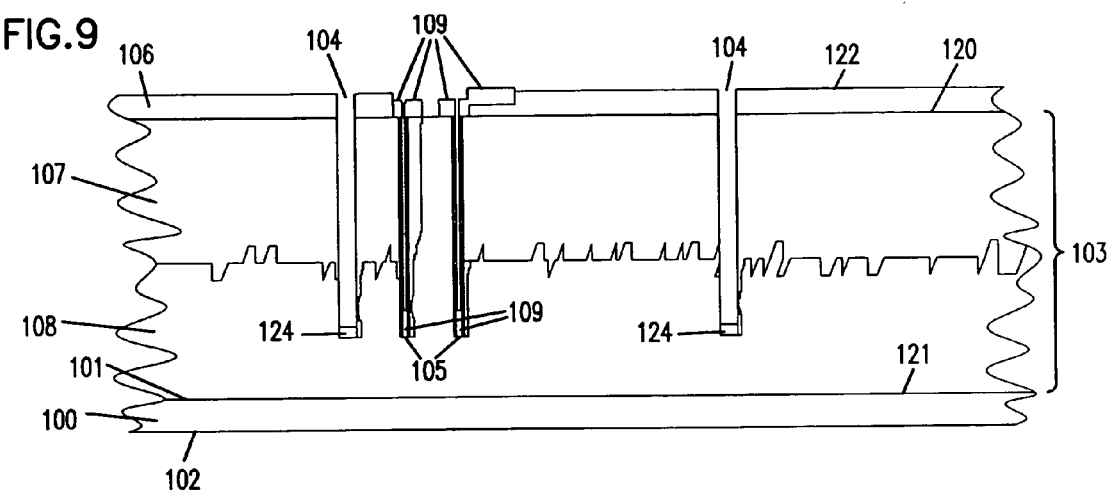

FIG. 9 depicts an exemplary device after the next step of the process, (placement, deposition, etc.) of the P-Ohmic metal. Placement of the P-Ohmic metal creates P-Ohmic regions 109 around and on the bottom of the oxidation trenches 105. Examples of materials useful as the P-Ohmic metal include, gold (Au) or a gold zinc (AuZn) alloy. A preferred material for the P-Ohmic metal is a gold zinc (AuZn) alloy. The deposition of the P-Ohmic metal can be accomplished by electron-beam evaporation. An exemplary set of conditions for this process is to deposit a gold zinc (AuZn) alloy at a thickness of about 0.2 µm.

Figure 10:
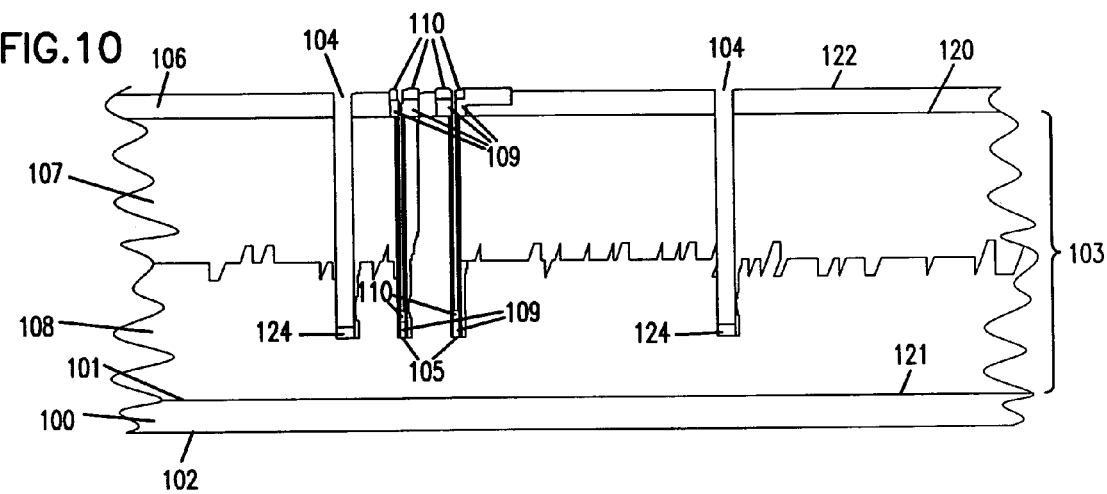

FIG. 10 represents an exemplary device after the next step of the process, another deposition of dielectric material. Dielectric material is deposited in and around the oxidation trenches 105 where the first dielectric layer 106 was removed in a previous step. This second deposition of dielectric material forms second dielectric regions 110. The second dielectric regions 110 can be made of any material that is known to be dielectric, such as silicon dioxide ($SiO_2$) or silicon nitride ($Si_3N_4$). Preferably, the second dielectric regions 110 are made of silicon dioxide ($SiO_2$).

The dielectric material can be deposited by any method known in the art. Preferably, the dielectric material is deposited by (PECVD). The thickness of the second dielectric regions 110 can vary depending on the specific application, and can range from 1000 to 5000 angstroms. Preferably, the thickness of the second dielectric regions 110 is about 2900 angstroms.

Figure 11:
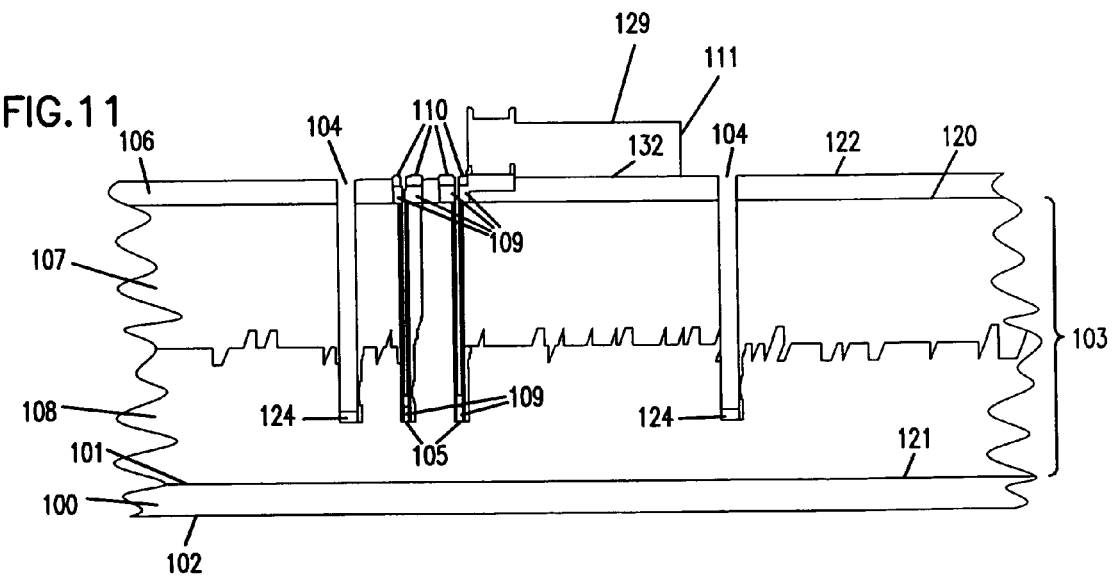

FIG. 11 depicts an exemplary device after the next step in the process, deposition of a conductive material to form an upper anode interconnect metal. A conductive material is deposited on the first surface 122 of the first dielectric layer 106 to form an upper anode interconnect metal 111. Upper anode interconnect metal 111 has a first surface 129 and a second surface 132. Second surface 132 of upper anode interconnect metal 111 is in contact with first dielectric layer 106. Upper anode interconnect metal 111 functions as a contact for the optoelectronic device 130 of the device. The placement of upper anode interconnect metal 111 can vary within certain constraints. In this example, upper anode interconnect metal 111 must be situated on the first surface 122 of the dielectric layer 106, contained entirely within the isolation moat 104, contained within a region between isolation moat 104 and one of the oxidation trenches 105, and in contact with the P-Ohmic region 109.

Upper anode interconnect metal 111 is made of any suitable conductive material, such as a metal, e.g., gold (Au), silver (Ag), copper (Cu), aluminum (Al), tungsten (W), an alloy, e.g., aluminum/copper (Al/Cu), titanium tungsten (TiW), or the like. Preferably, the conductive material that is utilized is gold, and is preferably deposited by E-Beam deposition. An exemplary set of conditions for this step are to deposit a 1.5 µm thick layer of gold by E-Beam deposition.

FIG. 12 begins the bottom side processing steps and illustrates an exemplary device after the next step of the method, the etching of the substrate 100. The substrate 100 is etched from its lower surface 102. The entire substrate 100 is removed in this etching step, leaving the first surface 121 of the epitaxial layer 103 exposed.

The etching is accomplished using both chemical and mechanical methods of polishing. An exemplary method is to lap the wafer using 12 µm grit at 20 RPM to a thickness of about 10 µm.

FIG. 13 represents an exemplary device after the next step in the process of its manufacture, deposition of a third dielectric layer. A dielectric material is deposited on the first surface 121 of the epitaxial layer 103, forming a second dielectric layer 113. The second dielectric layer 113 has a first surface 126 and a second surface 123. The first surface 126 contacts the first surface 121 of the epitaxial layer 103. The second dielectric layer 113 can be made of any material that is known to be dielectric, such as silicon dioxide ($SiO_2$) or silicon nitride ($Si_3N_4$). Preferably, the second dielectric layer 113 is made of silicon dioxide ($SiO_2$).

The dielectric material can be deposited by any method known in the art. Preferably, the dielectric material is deposited by PECVD. The thickness of the second dielectric layer 113 can vary depending on the specific application, and can range from 1000 to 5000 angstroms. Preferably, the thickness of the second dielectric layer 113 is about 7500 angstroms.

FIG. 14 illustrates an exemplary device after a subsequent process step, ion implantation. Ions are implanted through the second surface 123 of the second dielectric layer 113. The ions penetrate into the non-implanted region 108 of epitaxial layer 103 forming a lower implanted region 114 of epitaxial layer 103. There is also a region below the isolation moat 104 where this ion implantation step deposits ions, the moat ion implantation region 131.

The ion implantation into epitaxial layer 103 forming the lower implanted region 114 can be achieved by implanting any suitable ion, such as boron, oxygen, or hydrogen. A preferred ion for implantation is hydrogen. Typically, the hydrogen ions are implanted with an energy that ranges from 20 to 400 keV, with from about 50 to 300 keV being a preferred range. The dose of hydrogen ions to be implanted ranges from about $10^{12}$ to $10^{16}/cm^2$, with a preferred range being from about $10^{13}$ to $10^{15}/cm^2$. An exemplary set of conditions for this step is to do multiple implants of 100, 200, and 300 keV, all at a dose of $10^{15}/cm^2$.

FIG. 15 represents an exemplary device after the next step of the process, the etching of the through wafer via 115. Through wafer via 115 is formed by etching from the second surface 123 of the second dielectric layer 113. Through wafer via 115 is formed in a location that allows it to contact the upper anode 111 when the etch has gone completely through second dielectric layer 113, epitaxial layer 103, and first dielectric layer 106. Therefore, through wafer via 115 is on the order of about 10 µm in length, and is preferably about 9.5 µm in length. The through wafer via 115 is formed by any suitable etching method, but is preferably carried out with RIE. An exemplary set of conditions for forming the through wafer via 115 is to etch for about 30 minutes using C12/BC13 as an etching gas at a chamber pressure of about 15 mT and about 100 W of power.

FIG. 16 depicts an exemplary device of the invention after the next step of the process, deposition of N-Ohmic metal. Placement of the N-Ohmic metal creates N-Ohmic region 116. N-Ohmic region 116 has first surface 127 and second surface 128. First surface 127 of N-Ohmic region 116 contacts non-implanted region 108 of epitaxial layer 103. The position of N-Ohmic region 116 is dictated by the position of oxidation trenches 105. N-Ohmic region 116 should be positioned directly below oxidation trenches 105. Examples of materials useful as the N-Ohmic metal include, gold (Au), gold/germanium nickel (AuGe/Ni) alloy or a gold paladium (AuPd) alloy. A preferred material for the N-Ohmic metal is a gold germanium/nickel (AuGe/Ni) alloy. The deposition of the N-Ohmic metal is preferably accomplished by E-Beam evaporation. An exemplary set of conditions for this step is to deposit a 0.2 µm layer of a gold germanium/nickel (AuGe/Ni) alloy by E-Beam evaporation.

FIG. 17 illustrates an exemplary device of the invention after the next step of the process, deposition of a conductive material on the bottom of the device. A conductive material is deposited on portions of the second surface 123 of the second dielectric layer, the inner walls of through wafer via 115, the second surface 130 of upper anode 111, and the second surface 128 of the N-Ohmic region 116. The conductive material forms lower anode 117, and cathode 118. The conductive material deposited on the inner walls of through wafer via 115, and second surface 130 of upper anode 111 serves to electrically connect lower anode 117 with upper anode 111. Cathode 118 is positioned so it is in contact with second surface 123 of second dielectric material 113 and second surface 128 of N-Ohmic region 116.

Upper anode 111 is made of any suitable conductive material, such as a metal, e.g. gold (Au), silver (Ag), copper (Cu), aluminum (Al), tungsten (W), an alloy, e.g., aluminum/copper (Al/Cu), titanium tungsten (TiW), or the like. Preferably, the conductive material that is utilized is gold, and is deposited by electro-plating. An exemplary set of conditions for this step is to deposit 2 µm of gold (Au) by conventional electro-plating methods.

It should be understood that the exemplary order of the process steps given above can be varied. For example, an alternative order of bottom side processing is depicted in the scheme illustrated by FIGS. 10, 14, 13, 12, 11, 15.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The invention claimed is:

1. A method of producing a device comprising the steps of:
   (a) forming at least one optoelectronic structure, where formation of the at least one optoelectronic structure comprises depositing an epitaxial layer on a substrate;
   (b) forming a through wafer via extending from a top surface to a bottom surface of said device; and
   (c) forming an isolation moat in said device using both etching and ion implantation processes, wherein said isolation moat is disposed about said through wafer via and said at least one optoelectronic structure, and said isolation moat extends into the epitaxial layer.

2. The method of claim 1, wherein said at least one optoelectronic structure is a vertical cavity surface emitting laser.

3. The method of claim 1, additionally comprising the step of forming at least two anodes, positioned on said top and bottom surfaces of said device.

4. The method of claim 3, additionally comprising the step of electrically connecting said two anodes through the through wafer via.

5. The method of claim 4, wherein the step of electrically connecting said two anodes through the through wafer via comprises coating the inner walls of said through wafer via with an electrically conductive material.

6. The method of claim 5, wherein the conductive material is a conductive metal.

7. The method of claim 6, wherein the conductive metal is gold.

8. The method of claim 1, wherein said through wafer via is formed with Reactive Ion Etching (RIE).

9. The method of claim 1, additionally comprising the step of implanting ions in said device into a region beneath the isolation moat.

10. The method of claim 9, wherein said ion implantation implants hydrogen ions.

11. The method of claim 1, further comprising defining an oxidation trench in the device, the oxidation trench extending into the epitaxial layer.

12. The method of claim 1, wherein forming at least one optoelectronic structure comprises forming both a laser and a photodetector.

13. The method of claim 1, wherein forming at least one optoelectronic structure comprises forming a stack that includes both a laser and a photodetector.

14. The method of claim 1, further comprising forming at least two cathodes, one of which is positioned on said top surface of said device and one of which is formed on said bottom surface of said device.

15. The method of claim 14, further comprising electrically connecting said two cathodes through the through wafer via.

16. A method of producing a device comprising the steps of:
   (a) forming at least one optoelectronic structure, where formation of the at least one optoelectronic structure comprises depositing an epitaxial layer on a substrate;
   (b) forming a through wafer via extending from a top surface to a bottom surface of said device; and
   (c) forming an isolation moat in said device using an etching process, wherein said isolation moat is disposed about said through wafer via and said at least one optoelectronic structure, and said isolation moat extends into the epitaxial layer.

17. The method of claim 16, wherein the etching process is Reactive Ion Etching.

18. The method of claim 16, additionally comprising the step of forming at least two anodes, positioned on said top and bottom surfaces of said device and electrically connecting said two anodes through the through wafer via by coating the inner walls of said through wafer via with an electrically conductive material.

19. The method of claim 16, additionally comprising the step of implanting ions in said device into a region beneath the isolation moat.

20. The method of claim 16, further comprising forming at least two cathodes, one of which is positioned on said top surface of said device and one of which is formed on said bottom surface of said device and electrically connecting said two cathodes through the through wafer via.

* * * * *